United States Patent [19]

Camarda et al.

[11] Patent Number: 5,527,588

[45] Date of Patent: Jun. 18, 1996

[54] MICRO HEAT PIPE PANELS AND METHOD FOR PRODUCING SAME

[75] Inventors: Charles J. Camarda, Virginia Beach, Va.; George P. Peterson, College Station, Tex.; Donald R. Rummler, Hampton, Va.

[73] Assignees: The United States of America as represented by the Administrator of the National Aeronautics and Space Administration, Washington, D.C.; Texas A&M University, College State, Tex.

[21] Appl. No.: 433,009

[22] Filed: May 3, 1995

Related U.S. Application Data

[62] Division of Ser. No. 320,622, Oct. 6, 1994.

[51] Int. Cl.⁶ .......................................... B32B 3/20
[52] U.S. Cl. ........................... 428/188; 428/178; 428/212; 428/913; 52/793.1
[58] Field of Search ....................... 428/178, 188, 428/72, 212, 913; 52/793.1; 165/104.11

[56] References Cited

U.S. PATENT DOCUMENTS

| 5,042,565 | 8/1991 | Yuen et al. | 165/41 |
| 5,179,043 | 1/1993 | Weichold et al. | 437/225 |
| 5,219,020 | 6/1993 | Akachi | 165/104.26 |

*Primary Examiner*—Donald J. Loney
*Attorney, Agent, or Firm*—Robin W. Edwards

[57] ABSTRACT

Flat or curved micro heat pipe panels are fabricated by arranging essentially parallel filaments in the shape of the desired panel. The configuration of the filaments corresponds to the desired configuration of the tubes that will constitute the heat pipes. A thermally conductive material is then deposited on and around the filaments to fill in the desired shape of the panel. The filaments are then removed, leaving tubular passageways of the desired configuration and surface texture in the material. The tubes are then filled with a working fluid and sealed. Composite micro heat pipe laminates are formed by layering individual micro heat pipe panels and bonding them to each other to form a single structure. The layering sequence of the micro heat pipe panels can be tailored to transport heat preferentially in specific directions as desired for a particular application.

6 Claims, 3 Drawing Sheets

MICRO HEAT PIPE PANELS AND METHOD FOR PRODUCING SAME

The invention described herein was jointly made by employees of the United States Government and an employee of The Texas A & M University, and may be manufactured and used by or for the Governmental purposes without the payment of any royalties thereon or therefor.

This is a divisional of application Ser. No. 08/320,622 filed on Oct. 6, 1994, pending.

BACKGROUND OF THE RELATED ART

1. Field of the Invention

The present invention relates generally to the formation of heat pipe panels and more particularly to composite micro heat pipe laminates formed from a plurality of individual micro heat pipe panels and a method of forming micro heat pipe panels.

2. Description of the Related Art

Micro heat pipes are small, wickless heat pipes which have a hydraulic diameter of the same order-of-magnitude as the capillary radius of the working fluid. Liquid transport is accomplished by the formation of a meniscus of fluid in the corners of the heat pipe due to the surface tension forces of the working fluid. The cross-sectional dimension of such heat pipes is on the order of 0.01 to 0.1 inches and the length is on the order of inches.

The concept of using heat pipes for thermal management has been used in applications ranging from semiconductor devices to the leading edges of various aircraft structures. In leading edge applications, active cooling alone cannot accomodate the magnitude and local nature of the heating associated with shock interference heating on the engine cowl lip of a hypersonic vehicle. The heating can be as high as 100,000 $BTU/ft^2$-sec over a 0.01-inch region. The purpose of the micro heat pipe panel is to distribute the heat over a large area so it can be effectively absorbed by an alternate system, such as active cooling (e.g., forced convection). The small size of the individual heat pipes within the micro heat pipe panel also enables an increased survivability in the event of a particle penetration or puncture.

Small width heat pipe panels using the same principles as the leading edge application can also be bonded to the underside of micro chips to enhance cooling and reliability and prolong the life of the electronics. In both these applications, the micro heat pipes are essentially parallel and embedded in the panel material.

Current methods of micro heat pipe fabrication are described by Cotter in reference to silicon micromechanical devices and typically include forming channels in a substrate followed by enclosing the channels, e.g., by bonding a plate to the substrate surface. Cotter, T. P., 1984, "Principals and Prospects of Micro Heat Pipes", Proc. 5th Int'l Heat Pipe Conf., Tsukuba, Japan, pp. 329–330.

In a related method, U.S. Pat. No. 5,179,043 to Weichold et al. discloses a method of cooling integrated circuit chips using micro heat pipes. Methods of forming the heat pipes on a surface of the chips are also disclosed. A groove, e.g., rectangular or trapezoidal, is cut into a semiconductor substrate. After grooving, layers of heat conductive material are formed on the chip by vapor deposition. This material seals the grooves, leaving micro heat pipe channels of roughly triangular cross-section.

These techniques for micro heat pipe fabrication permit only a limited number of configurations of the tubes that define the micro heat pipes.

Reflecting the more conventional approach to tube formation for heat pipes, U.S. Pat. No. 5,219,020 to Akachi discloses a structure of a micro heat pipe having an elongated metallic capillary robe having an inner diameter of up to 1.2 mm. A bi-phase compressible working fluid is sealed in the capillary tube to form a loop-type flow path between alternately arranged heat receiving portions and heat radiating portions.

In another example of tube formation, Japanese Publication No. 55-99586 to Sasaki discloses manufacturing of extra fine heat pipes using extra fine glass fiber tube rather than conventional metallics. And in another example of tube formation, Japanese Publication No. 63-226595 to Nakabashi discloses a micro heat pipe comprising a capillary tube having a working fluid inside. The pipe has an inner diameter of 2–3 mm.

A leading edge structure is illustrated by U.S. Pat. No. 5,042,565 to Yuen et al. which discloses a fiber-reinforcing composite leading edge heat exchanger and a method for producing the same. The heat exchanger includes a V-shaped composite wall that houses parallel passages. The wall thickness is typically less than 0.05 inches.

As illustrated by the above examples, in situ formation of micro heat pipes results in limitations on the possible tube configuration. In addition, existing panel configurations containing embedded micro heat pipes typically have a parallel heat pipe arrangement resulting in thermal conductivity that is limited to the direction of the heat pipes. Thus, there is a need in the art for a wider variety of embedded micro heat pipe configurations and increased effective thermal conductivity beyond that achievable with an array of parallel micro heat pipes. It, therefore, is an object of this invention to provide an improved micro heat pipe panel and composite micro heat pipe laminate which can have diverse robe configurations and which can improve the effective in-plane thermal conductivity.

SUMMARY OF THE INVENTION

Accordingly, flat or curved micro heat pipe panels of the present invention are fabricated by arranging essentially parallel filaments in the shape of the desired panel. The configuration of the filaments corresponds to the desired configuration of the tubes that will constitute the heat pipes. Filaments with various surface roughnesses can also be used to create a roughened internal surface of the individual tubes to enhance liquid transport within the tubes. In addition, the filaments must be made of a material that is stable during deposition of the panel material and which can be subsequently removed from the formed panel. A thermally conductive material is then deposited on and around the filaments to fill in the desired shape of the panel. The filaments am then removed, leaving tubular passageways of the desired configuration and surface texture in the material. Removal of the filaments is accomplished by leaching out the filament or mechanically removing it. The tubes are then filled with a working fluid and sealed.

Composite micro heat pipe laminates are formed by layering individual micro heat pipe panels and bonding them to each other to form a single structure. Each micro heat pipe panel is rotated in-plane so that the micro heat pipe arrays in adjacent panels are rotated relative to each other. This relative rotation of layered panels improves the effective thermal conductivity of the laminate by increasing the number of array directions and thereby increasing the number of directions available for thermal flow. The layering sequence of the micro heat pipe panels in the composite micro heat pipe laminate can thus be tailored to transport heat preferentially in specific directions as desired for a particular application.

BRIEF DESCRIPTION OF THE DRAWINGS

Other objects, features and advantages of the present invention will become more fully apparent from the following detailed description of the preferred embodiment, the appended claims and the accompanying drawings in which:

DESCRIPTION OF THE PREFERRED EMBODIMENTS

Figure 1:
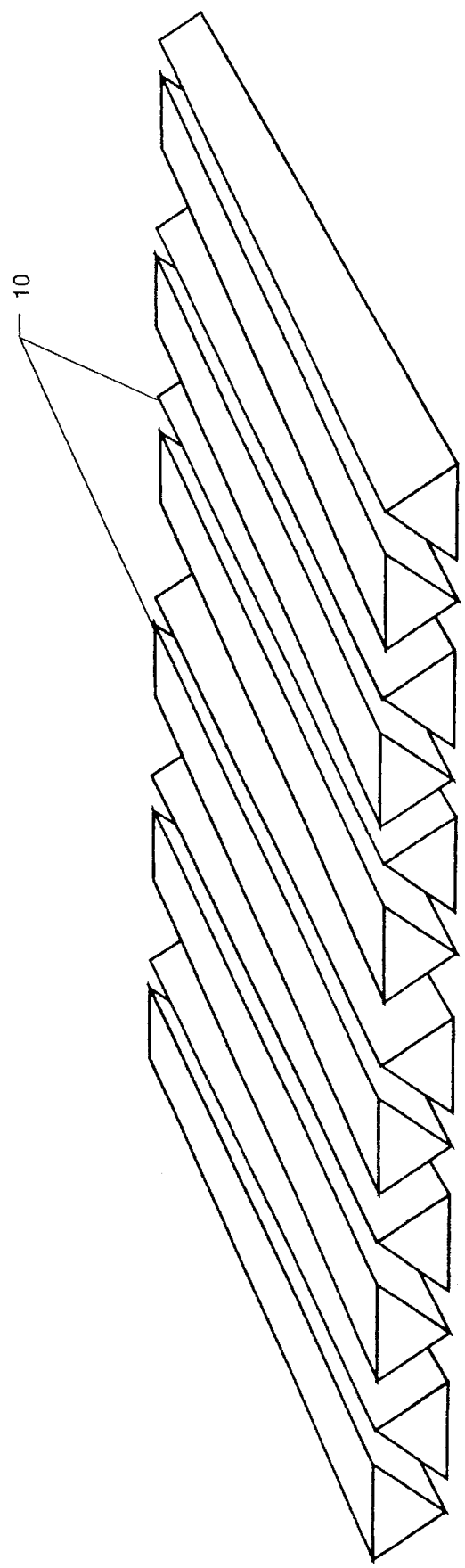
FIG. 1 is a three-dimensional diagram of the filament array for a flat panel prior to deposition of the thermally conductive panel material.
Figure 2:
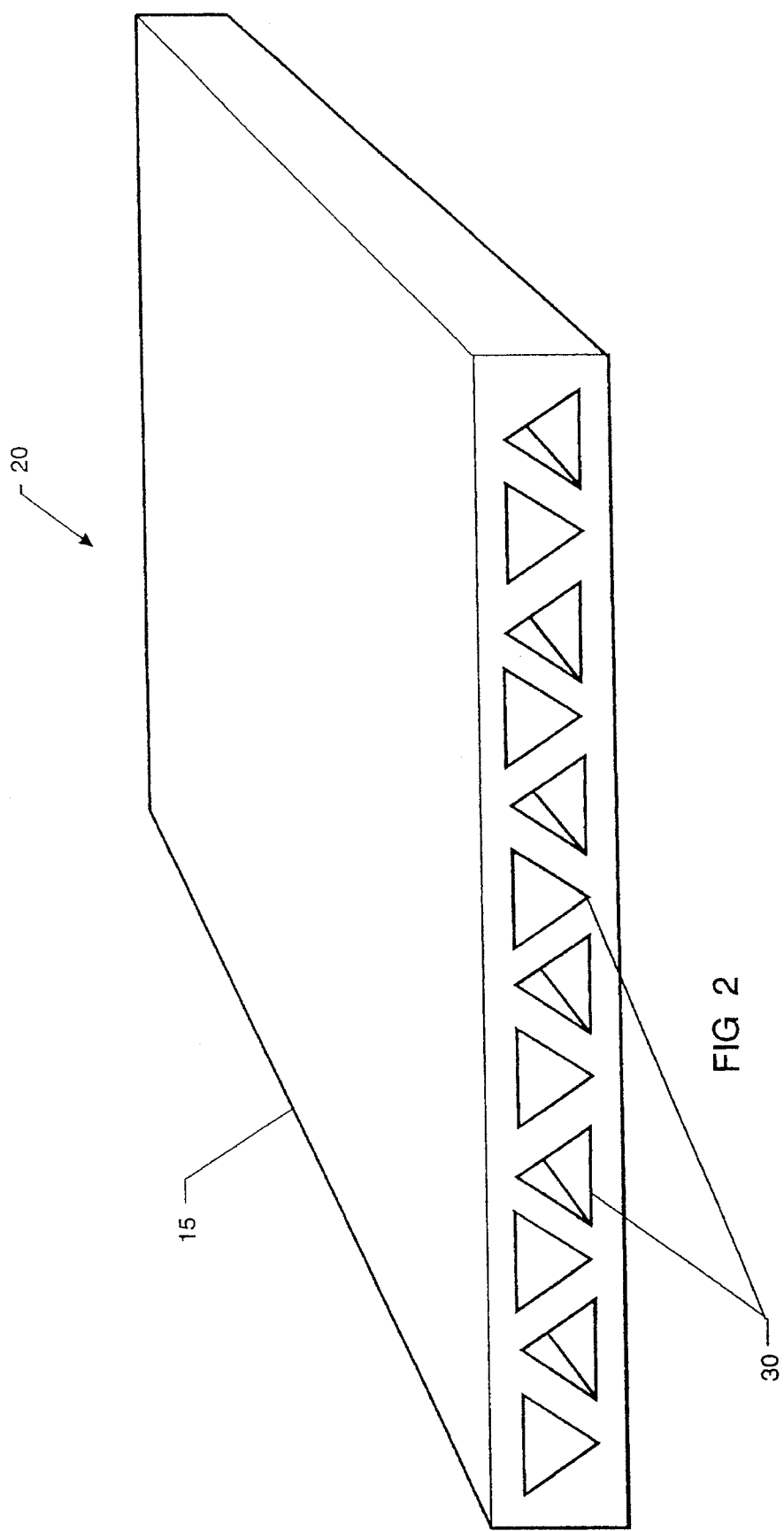
FIG. 2 is a three-dimensional diagram of a micro heat pipe panel according to the present invention.
Figure 3:
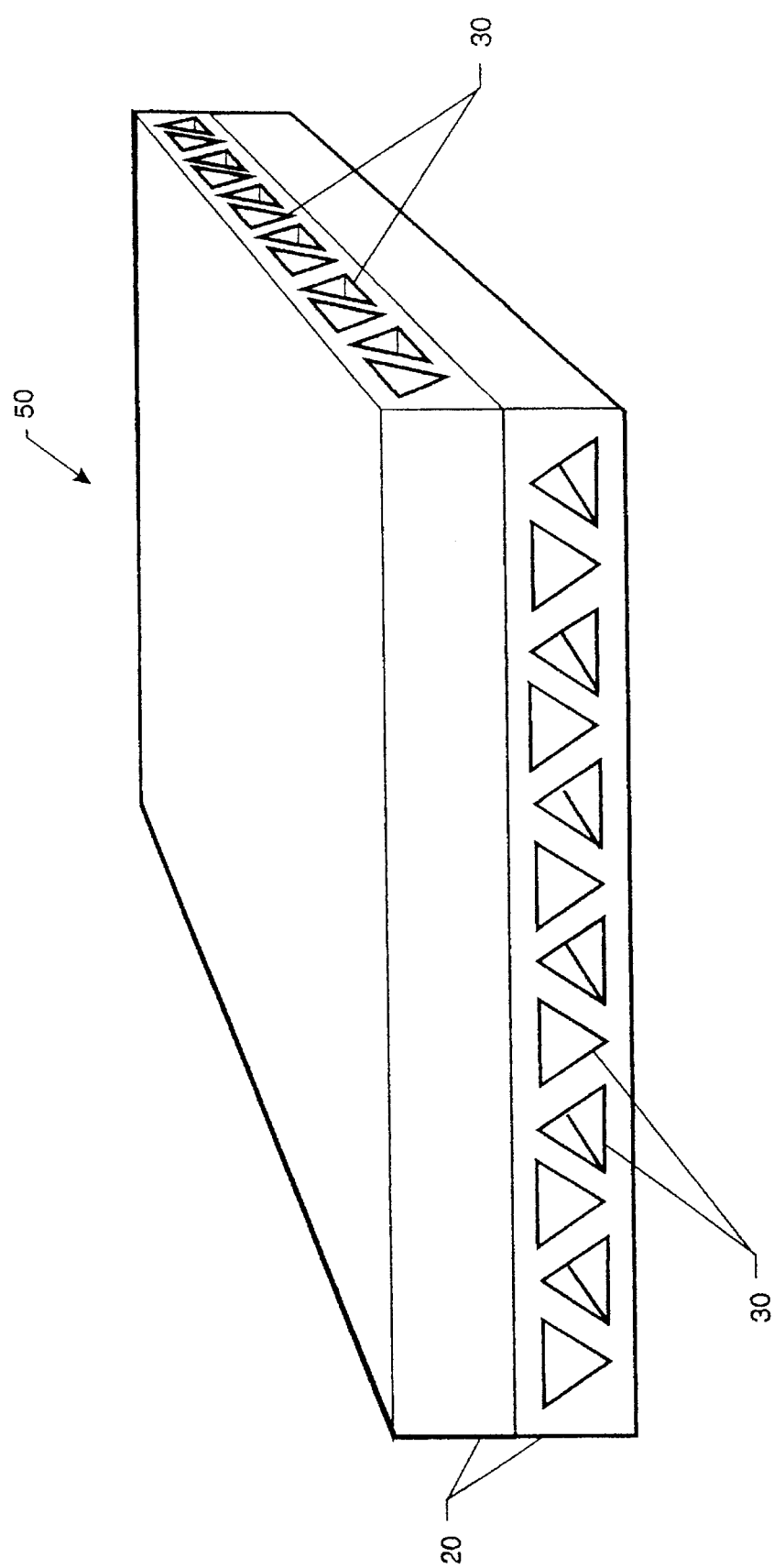
FIG. 3 is a three-dimensional diagram of a composite micro heat pipe laminate formed from layered micro heat pipe panels.

The preferred embodiment of tile present invention is illustrated in FIGS. 1 thru 3. With specific reference to FIGS. 1 and 2, a micro heat pipe panel 20 is formed by placing filaments 10 to conform with the desired shape of the panel. For example, in FIG. 1, molybdenum filaments 10 with a triangular cross section are laid out to define a flat panel. A thermally conductive material 15 is then vapor deposited on and around the filaments 10 to form the final panel shape. For this purpose, tungsten and tungsten-rhenium have been found to be particularly suitable. The filaments 10 are then mechanically removed from the panel 20 leaving behind tubular passageways 30. One edge of the panel 20 having the tube openings is sealed and the open edge is fitted with a manifold for evacuating and filling all the micro heat pipes. Alternatively, the panel can be fabricated with one of the edges containing tile tube ends sealed. A high-temperature working fluid such as lithium is then placed in each micro heat pipe and the edge of the panel having the remaining tube openings is sealed.

In FIG. 3, two micro heat pipe panels 20 fabricated according to the above method are layered and bonded to form a composite micro heat pipe laminate 50. The upper panel is rotated relative to the lower panel to vary the relative orientations of adjacent arrays of tubes 30 and better transport heat in two directions. In the preferred embodiment illustrated in FIG. 3, only two panels 20 are shown, with the tube array of the upper panel oriented at a right angle to the tube array of the bottom panel. With the tubes 30 filled with working fluid and sealed, this configuration would exhibit orthotropic thermal conductivity in the plane of the panel 50. In addition, the multiple layers could serve to add redundancy in the design of various thermal management systems. The principal application of the present invention is to act as a highly conductive outer skin for a cooled leading edge of an engine cowl, or the leading edge or cowl leading edge of a hypersonic vehicle. The composite micro heat pipe laminate would spread the extremely high, local heating near these leading edges over a larger area to enable the efficient absorption of the heat by some other means such as backside convective/conductive cooling. In another application, spaceborne systems could be laser hardened using the composite micro heat pipe laminate of the present invention coupled with a passive heat absorbing medium such as a phase-change material. The laminate would disperse a local laser strike over a large area and thus prevent a local failure to associated structures such as a radiator element of a satellite or space station. This invention could also be used could also be used for thermal management in micromechanical devices.

Although the preferred embodiment shows only a two-layered composite micro heat pipe laminate 50 with the micro heat pipe arrays positioned orthogonal to each other, other configurations are possible. The number of layers can be increased and the relative rotations of adjacent layers of micro heat pipe panels can be modified in order to increase the effective thermal conductivity of the panel by providing multiple thermal flow paths represented by each layer in the laminar panel.

While the micro heat pipe panel and composite micro heat pipe laminate of the present invention have been disclosed in connection with the above mentioned preferred embodiment, it should be appreciated that alternate embodiments fall within the scope of the invention. For example, the filaments may be graphite, glass, metal or any other material that can create the desired heat pipe shape and texture and remain substantially stable during subsequent processing steps. The material selected for the filaments must also be amenable to removal from the panel by chemical or mechanical means after the panel is formed.

In addition to tungsten, alternate thermally conductive materials may also be selected based on their ability to withstand the expected operating conditions of the panel. For example, metals such as molybdenum-rhenium and columbium may be used for high-temperature applications; a superalloy may be used for moderate temperatures; and metals such as aluminum or copper may be used for low temperature applications. Although vapor deposition is a particularly effective method of depositing the thermally conductive material to form the micro heat pipe panel, it is also possible to use a mechanical deposition method such as hot isostatic pressing.

In addition to mechanically removing the filaments from the formed panel, various techniques can be used to facilitate removal of the filaments after deposition of the thermally conductive material. For example, the filament materials may be leached out using known chemical means. In addition, it is possible to coat the filaments with a release agent prior to the deposition step to aid mechanical removal of the filaments. For flat or nearly flat panels, the filaments may also be selected with a significant difference in thermal expansion from the deposited panel material such that the filaments contract upon cooling from the deposition temperature to enable easier removal.

The selection of a particular working fluid depends on the use temperature, application and compatibility of the fluid with the surrounding micro heat pipe material. Working fluids for high to lower operating temperature micro heat pipe panels can range from the liquid metals such as lithium to water, respectively. The amount of liquid fill for the micro heat pipes is predetermined for optimum performance by methods well known to those skilled in the art. The amount is controlled by the level of liquid fill in the panel. The liquid level can be determined by heating the working fluid, and filling the panel while monitoring the liquid level by a thermal imaging device (e.g., IR thermography, neutron radiography, or gamma densitometry). After the working fluid is placed in the tubes, the open ends are sealed.

While the present invention has been disclosed in connection with the preferred embodiments thereof, it should be understood that there may be other embodiments which fall within the spirit and scope of the invention as defined by the following claims.

We claim:

1. A composite micro heat pipe laminate comprised of:

a plurality of micro heat pipe panels layered and bonded to each other such that conductivity between adjacent panels is maintained; and each micro heat pipe panel is further comprised of substantially parallel micro heat pipes formed as tubular passageways in a deposited, thermally conductive material and containing working fluids, with adjacent micro heat pipe panels in the composite micro heat pipe laminate having micro heat pipe orientations that differ from each other by a desired amount to tailor the thermal conductivity of the composite micro heat pipe laminate.

2. The laminate of claim 1, wherein the thermally conductive material is deposited using hot isostatic pressing.

3. The laminate of claim 1, wherein the thermally conductive material is deposited using vapor deposition.

4. The laminate of claim 3, wherein the thermally conductive material is a metal.

5. The laminate of claim 4, wherein the metal is a superalloy.

6. The laminate of claim 4, wherein the thermally conductive metal is selected from the group of materials consisting of tungsten, tungsten-rhenium, molybdenum-rhenium, columbium and aluminum-copper.

* * * * *